United States Patent [19]

Neugebauer

[11] Patent Number: 4,774,632
[45] Date of Patent: Sep. 27, 1988

[54] HYBRID INTEGRATED CIRCUIT CHIP PACKAGE

[75] Inventor: Constantine A. Neugebauer, Schenectady, N.Y.

[73] Assignee: General Electric Company, Schenectady, N.Y.

[21] Appl. No.: 70,746

[22] Filed: Jul. 6, 1987

[51] Int. Cl.[4] .............................................. H05K 7/20
[52] U.S. Cl. ..................................... 361/386; 357/74; 357/79; 357/81; 361/388; 361/414
[58] Field of Search ....................... 357/74, 86, 81, 79; 361/386–389; 174/414, 68.5

[56] References Cited

U.S. PATENT DOCUMENTS

| | | | |
|---|---|---|---|
| 4,322,778 | 3/1982 | Barbour et al. ..................... | 174/68.5 |
| 4,498,122 | 2/1985 | Rainal ................................ | 361/414 |
| 4,541,035 | 9/1985 | Carlson et al. ..................... | 361/414 |

OTHER PUBLICATIONS

Ho et al., "Multiple LSI Silicon Chip Modules with Power Bases Composed of Laminated Silicon Sheets with Metallized Upper and Lower Surfaces", IBM Technical Disclosure Bulletin, vol. 22, No. 8A, 1/80, pp. 3410–3411.

Primary Examiner—J. R. Scott
Assistant Examiner—Gregory D. Thompson
Attorney, Agent, or Firm—Robert Ochis; James C. Davis, Jr.; Marvin Snyder

[57] ABSTRACT

A hybrid integrated circuit chip package is disclosed which includes a hybrid, low loss, multilayer metallization, silicon printed wiring board as an interconnecting, two-sided module to reduce the length of interconnections between integrated circuit chips positioned on opposite sides of the module.

12 Claims, 4 Drawing Sheets

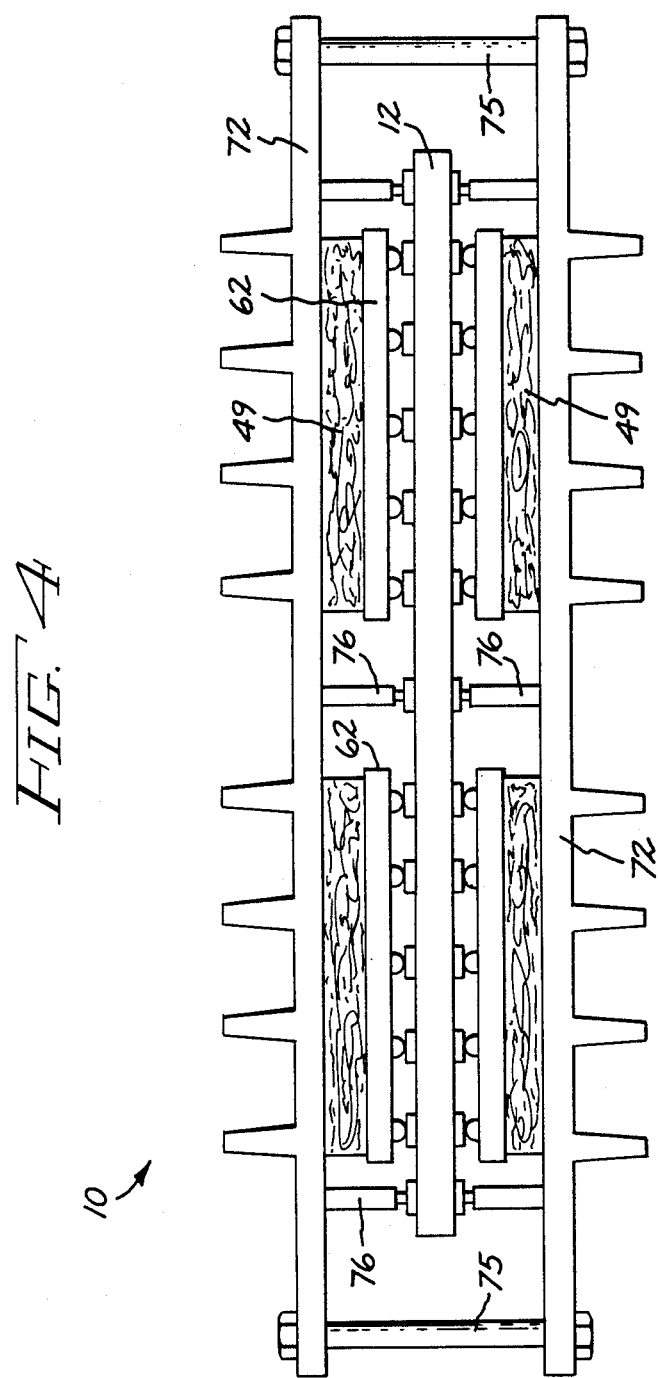

HYBRID INTEGRATED CIRCUIT CHIP PACKAGE

The disclosed invention relates generally to a packaging system for integrated circuit chips containing electronic devices connected in functional circuits and, more specifically, to a high performance superdensity enclosure for interconnecting and packaging a plurality of VLSI chips in a functional relationship. The disclosed packaging system provides enhanced miniaturization and facilitates testing and replacement of defective chips.

BACKGROUND OF THE INVENTION

Chip oriented technologies are playing an ever increasing roll in product innovation and improvement. While chip complexity is approaching the 1 megabit milestone, products often require more capabilities than can be adequately incorporated in a single chip. Moreover, it is often preferred, particularly in the case of extensive large scale systems such as super computers, that the system not be over-integrated to avoid the possibility that an entire expensive assembly may have to be scraped because of the failure of a relatively minor part. Accordingly, it is becoming increasingly common for chip oriented technologies to be implemented as chip sets comprising a plurality of individual chips designed to be interconnected and to interact in a prespecified manner. A typical chip set might, for example, include chips which provide a microprocessor, one or more interface chips, a permanent memory such as a read only memory (ROM), and a volatile storage such as a random access memory (RAM). While chip sets can contain as few as two or three chips, chip sets for computers typically contain several hundred or even thousands of chips. VLSI chips in a set may typically include up to 64 or more external connections and the majority of these connections are directed to interfacing with other chips.

Information processing equipment such as computers or other signal processors employ chip sets containing hundreds or thousands of chips. The cost of these systems directly relate to the cost of packaging and interconnecting the chips in a set in a desired functional relationship. Further, the operating speed of a system and the chips comprising the system play an important role in the successful implementation of new technologies. Interconnections between chips contribute to signal propagation delay and signal distortion. In addition, the packaging system must be capable of dissipating as much heat as it generates in order to maintain thermal equilibrium. Conventional packaging systems employing printed circuit boards are unable to handle the required number of chips within a volume and at a density which is readily compatible with the requirements of more advanced circuit applications. In addition, chips mounted on typical ceramic base substrates commonly operate at clock rates of less than 50 MHz. While ceramic substrates are satisfactory for low frequency chips, more advanced hybrid VLSI electronic systems often require clock rates in excess of 50 MHz. Moreover, chips disposed on an exposed substrate are susceptible to contamination.

A silicon circuit board which incorporates multiple levels of patterned conductors is disclosed in U.S. Pat. No. 4,541,035 issued to R. O. Carlson, H. H. Glascock, J. A. Loughran, and H. F. Webster, for a Low Loss Multilayer Silicon Circuit Board. The interconnection module of this invention bears some resemblance to the interconnecting board described in this patent.

OBJECTS OF THE INVENTION

Accordingly, it is a principal object of the invention to provide a packaging system for mounting and functionally interconnecting VLSI chips to establish a functional component of a larger device. The present invention provides a system in which all or a substantial portion of the chips of a particular set are structurally and electrically interconnected by a single interconnecting module made in substantial part of silicon and enclosed within an enclosure also made substantially of silicon material. The novel packaging system for hybrid VLSI chips minimizes the length of interconnections between the packaged chips and also minimizes the exterior dimension of the overall package, thereby reducing signal propagation delays. Moreover, the packaging system provides in-situ testing, repair and adjustment of component parts capabilities both during and after assembly of the package. Ideally, the packaging system should provide for retrofit replacement of outdated or defective chips or subsets of chips.

A further object of the present invention is to provide a hybrid packaging system for VLSI chips which provides a low signal loss, low propagation signal delay, low cross talk, and low power dissipation interconnect mechanism to allow a plurality of chips to effeciently communicate at very high clock rates approaching 100 MHz.

A yet further object of the present invention is to provide for a cost effective system for packaging a plurality of chips.

A still further object of the invention is to provide an improved hybrid packaging system for VLSI chips in which a plurality of chips can be assembled in a closely packed functional relationship.

It is a further object to provide a packaging system in which the heat generated by the package is dissipated in order to maintain thermal equilibrium and in which thermal coefficients of expansion of the various components of the package are closely matched by making the package substantially of silicon material.

It is a further object of the present invention to provide for hermeticity in a superdense high performance package system in which the chips are disposed according to a prespecified placement hierarchy in a closely spaced relationship and the lengths of the chip interconnections are minimized.

It is a further object of the invention to provide a superdensity hermetic high performance packaging system for VLSI chips which exhibits improved miniaturization.

SUMMARY OF THE INVENTION

The foregoing objects of the invention are achieved in a new high performance hermetic superdensity packaging system comprising a pair of hermetically sealed chip-holding assemblies in combination with a layered interconnect module. In the interest of achieving thermal compatibility, promoting heat transfer and reducing thermal stress a substantial portion of the package elements are fabricated from semiconductor materials exhibiting a coefficient of thermal expansion which closely matches the coefficients of expansion of the enclosed chips.

Each chip-holding assembly includes a primary chip-holding plate, a similarly shaped secondary plate forming a cover and spaced from said primary plate, and a plurality of interconnecting upstanding spacers which, together with the primary and secondary plates, form a hermetic enclosure for the chips. The primary plate of the chip holding assemblies includes a set of conductive passages for supplying ground, power and signal interconnections. These passages are coupled to corresponding ground, power and signal layers in the interconnect module. Full feedthrough conductive means are provided to couple signals between chips on opposite sides of the module.

In an alternative embodiment, the primary plate of the chip-holding asssembly is designed to hold the chips in an easily removable or demountable manner which facilitates rapid, automatic testing and repair or replacement.

BRIEF DESCRIPTION OF THE DRAWINGS

The features of the present invention, considered to be patentable to applicant, are specified in the claims appended hereto. The invention itself, however, both as to organization and method of operation, together with further objects, features and advantages thereof may be best understood with reference to the following detailed description when read in conjunction with the accompanying drawings in which:

FIG. 4 is a side view of a non-hermetically sealed embodiment of the package showing the use of demountable heat sink panels; and FIG. 5 is a view similar to FIG. 2 of an interconnect module employing patterned ground and power layers.

DETAILED DESCRIPTION OF THE INVENTION

Figure 1:
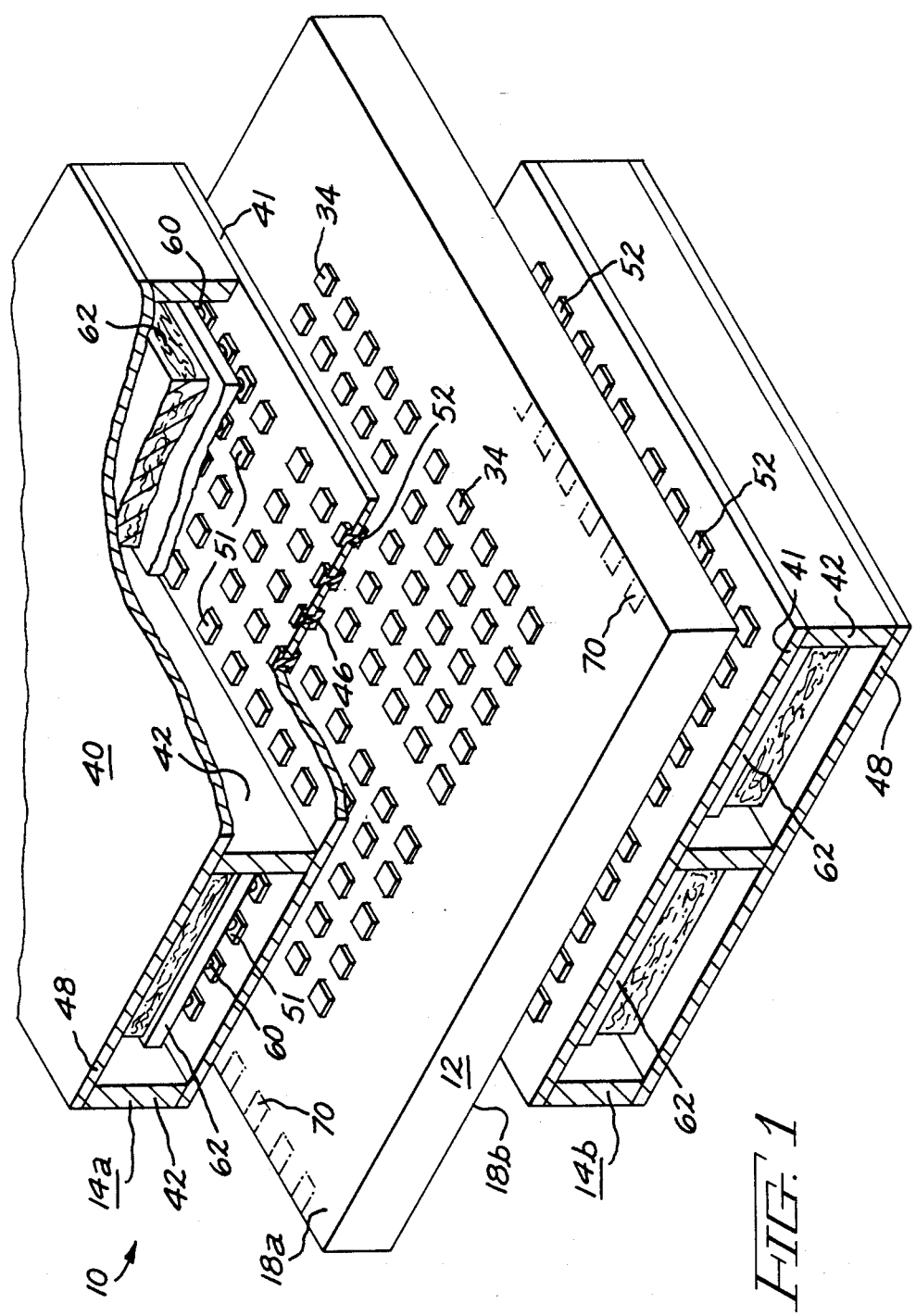
FIG. 1 is an exploded three-dimensional view, partially cut away, of a preferred embodiment of the semiconductor package of the present invention.

Referring now to the drawings, and particularly to FIG. 1, there is shown an exploded, three-dimensional view, partially cut away, of the preferred embodiment of the integrated circuit chip package 10 of the invention. The package 10 comprises an interconnect module 12 disposed between an upper chip-holding wafer assembly 14a and a lower chip-holding wafer assembly 14b, each of the assemblies 14a and 14b containing a plurality of VLSI chips 62. The chip-holding wafer assemblies are shown separated from interconnect module 12 in FIG. 1 for the sake of illustration only. When fully assembled, upper wafer assembly 14a is positioned in contact with an upper surface 18a of the interconnect module 12 and lower wafer assembly 14b is positioned in contact with a lower substrate surface 18b of the interconnect module 12 to form the completed package 10.

The interconnect module 12 serves to electrically interconnect the various chips 62 to each other and to the outside world by means of a multilayer conductive array. When the package 10 is fully assembled, contacts or terminals 60 on the chips 62, which may include bonding bumps, mate with associated contacts 51 and via conductive passages 46 are connected to contacts 52 all of which are on the chip-holding wafer assembly containing that chip. The contacts 52, in turn, mate with corresponding contacts 34 on the interconnect module as part of the scheme of the invention for electrical input and output couplings to the chips 62 and package in general. In this manner, power, ground and signal input/output requirements for the chips 62 are provided, as will be explained in greater detail below.

Figure 2:
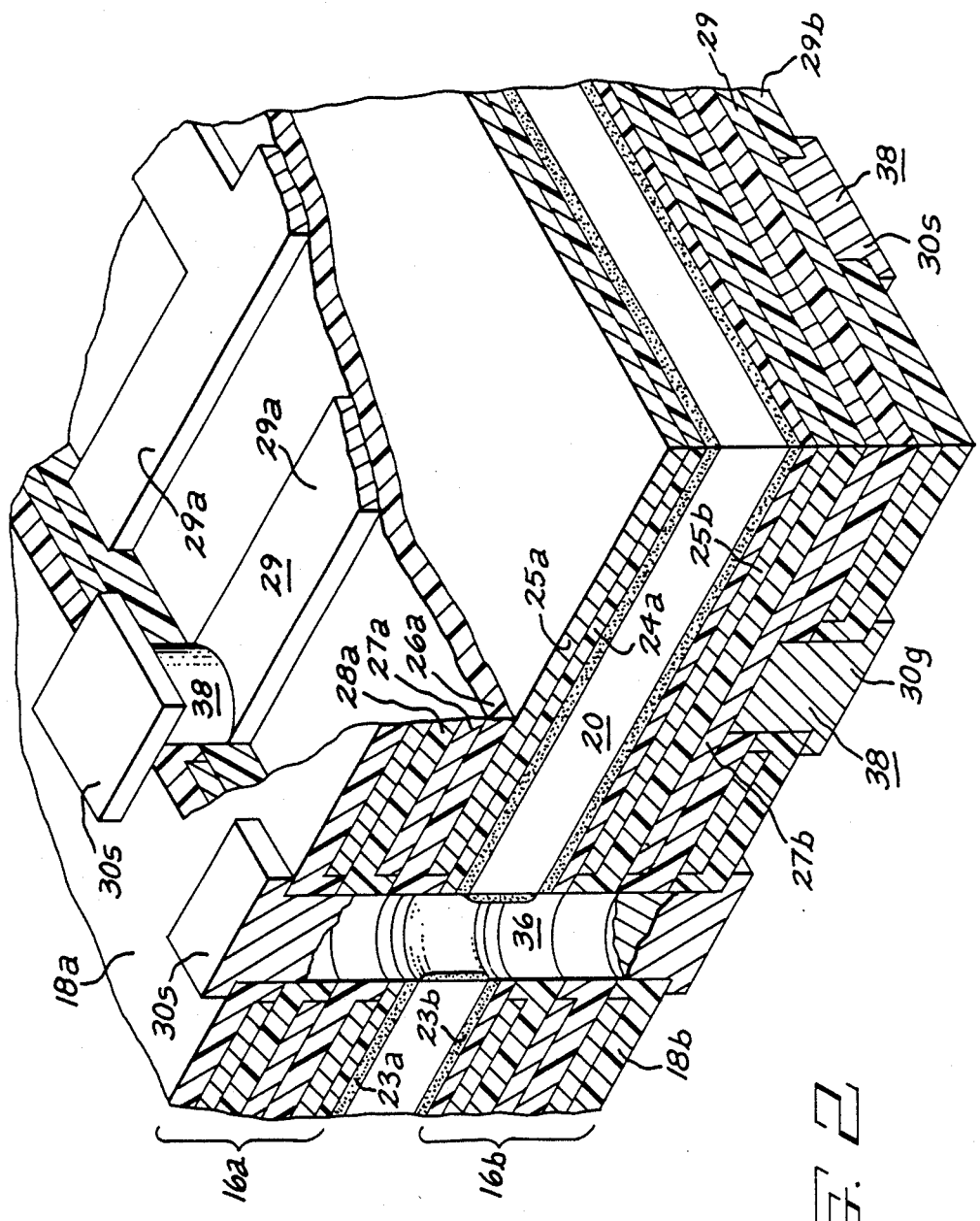
FIG. 2 is a three-dimensional view, partially in cross-section and partially cut away, of the interconnect module used in the present invention.

The details of the interconnect module 12 of the invention may be better understood from a study of FIG. 2 which is a three-dimensional view, partially in cross-section and partially cut away. As can be seen therefrom, the interconnect module 12 generally comprises a low loss, multilayer metallization, silicon printed wiring board. A planar insulating layer 20 forms the central substrate for the module 12. Disposed on opposite sides of the central insulating layer 20 are a first multilayer substrate 16a and a second multilayer substrate 16b. The insulating layer 20 is composed of high resistivity monocrystalline or polycrystalline silicon, which, beneficially, is closely matched in thermal expansion properties to the silicon semiconductor chips 62 housed in assemblies 14a and 14b and, further, which has a high thermal conductivity useful in removing heat. To further increase the resistivity of the layer 20, insulative layers 23a and 23b of very high resistivity material are deposited on the upper and lower surfaces of layer 20. A thermally-grown oxide of layer 20, particularly when formed in the presence of steam, is the preferred material for layers 23a and 23b. A typical thickness for such oxide layers 23a and 23b is about 1.0 micron. Other high resistivity materials may be used to implement layers 23a and 23b, however, examples being aluminum nitride, chemical vapor deposited silicon dioxide, and semi-insulating polycrystalline oxygen-doped silicon (SIPOS).

Multilayer substrates 16a and 16b present substantially parallel first and second surfaces 18a and 18b which face outwardly and away from the insulating inner layer 20. Each multilayer substrate 16a and 16b typically includes at least three conductor networks, one each for power, ground, and signal transmission electrical interconnections. Each of the above three conductor networks comprises a patterned or continuous sheet or film of conductor material arranged in a separate plane of the multilayer substrates 16a and 16b. Referring to FIG. 2, for example, multilayer substrate 16a includes an inner continuous conductor layer 25a for providing electrical power to chips 62, an outer conductive layer which is patterned to form a plurality of signal transmission lines 29a for providing communication between chips disposed in the chip-holding assembly 14a, and an intermediate continuous conductive layer 27a for providing electrical ground to the system. While the ground and power conductive layers 25a and 25b and 27a and 27b, respectively, are shown and have been described as being continuous layers in FIG. 2, it is equally possible and conventional to employ patterned layers for this purpose as shown in FIG. 5. Suitable insulating layers 24a, 26a and 28a are provided to electrically isolate each of the conductive layers from each other. An analogous arrangement of conductive and insulating layers is provided in multilayered substrate 16b which is formed on the side of insulating layer 20 opposite to substrate 16a. Outermost insulating layers 30a and 30b are also provided to protect the conductors 29a and 29b and to complete the multilayer substrates 16a and 16b.

Each of the outwardly facing substrate surfaces 18a and 18b has a plurality of outwardly facing contacts 34.

Some of the contacts 34 on the exposed faces 18a and 18b of the module comprise signal contacts 34s which are electrically coupled to the corresponding signal conductors 29a or 29b in the signal layer of the adjacent substrate 16a or 16b via partial conductive feedthroughs 38. Some signal contacts 34s may alternatively be coupled to other signal contacts 34s on the opposite face of the module 12 via full conductive feedthroughs 36. Some of the contacts 34 on the faces 18a and 18b comprise ground contacts 34g which are electrically connected to the ground layer 27a or 27b of the corresponding substrate 16a or 16b of the module and others comprise power contacts 34p which, in a manner similar to the ground contacts 34g are electrically coupled to the corresponding power layer 25a or 25b via partial feedthroughs which extend from the surfaces 18a and 18b to the layer 25a or 25b. The partial feedthroughs 38 in the module 12 are similar in construction to each other but differ only as to the depth to which they extend within the module 12.

Figure 3:
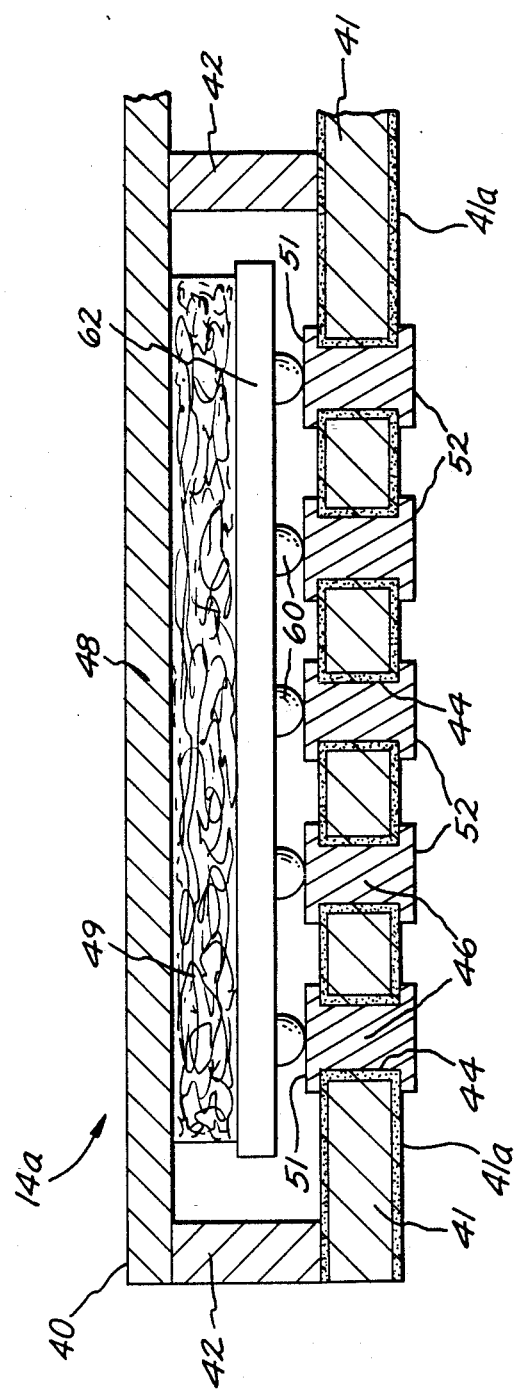
FIG. 3 is a cross-sectional view of a chip-holding assembly of the package.

Referring to FIGS. 1 and 3, the chipholding assemblies 14a and 14b each comprise hermetically sealed enclosure 40 conjointly formed by a primary plate 41, a secondary plate 48 and a plurality of intermediate spacer/separator plates 42. In upper assembly 14a, plates 41 and 48 comprise the bottom and top walls, respectively, of enclosure 40. The spacer plates 42 are upstanding and are joined to the primary and secondary plates 41 and 48 and to each other in any appropriate manner to form one or a plurality of rectangular volumes inside the enclosure 40. In addition, the plates are joined together in a manner and by appropriate materials to ensure a hermetic seal for the enclosure 40. The plates of the enclosure 40 are made of silicon material, the conventional raw material used for semiconductor fabrication being preferred.

The primary plates 41 of the enclosures 40 are rectangular and are oriented to face the interconnect module 12. They have formed therein a two dimensional array of openings 44 filled with conductive materials to form a plurality of electrical feedthroughs 46 electrically interconnecting opposed sides of the primary plate. Each of the feedthroughs 46 is filled with a conductive material which forms a first set of chip or internal contacts 51 on the side of the plate 41 inside the enclosure 40, and a second set of external contacts 52 on the side of the bottom wall facing the module 12. The set of contacts 51 inside the enclosure abuts associated input/output terminals in the form of conductive bumps 60 on an associated integrated circuit chip 62. The chips 62 themselves are compliantly or resiliently supported between the top wall 48 and bottom wall 41 by means of a copper gauze path 49 which serves to resiliently urge the chip contacts 60 into abutment with the set of contacts 51 on the interior side of the plate 41. The exact number of chips 62 contained in a given assembly is, of course, a matter of design choice. As alluded to above, the exterior set of contacts 52 on the assemblies abuts associated contact 34 on the proximate surface of the module 12 (FIG. 1).

The package 10 is assembled by providing any appropriate means for holding the chip-holding assemblies 14a and 14b in contact with the interconnecting module 12. For this purpose, the set of contacts 52 may be fixedly attached, as by solder, to the contacts 34 on the exterior of module 12. In the alternative, a bracket (not shown) may be provided to compress the assemblies 14a and 14b into abutment with the module 12 in a manner to be explained in greater detail with respect to FIG. 4.

In the fabrication of the interconnect module 12, an innermost silicon layer 20 is processed in a known manner to form thereon insulative silicon dioxide layers 23a and 23b. This is followed by the deposition of appropriate upper and lower first insulating layers 24a and 24b of a suitable insulating film in a conventional manner. While the preferred dielectric material for use as layer 24, as well as the additional layers 26, 28 and 30 (to be described hereinafter) comprises a polyimide-siloxane varnish such as GE type SPI-1000, these layers may comprise any suitable polymer such as ULTEM TM resin (as sold by General Electric Co.) polysulfone, XYDAR TM (as sold by Dart Company) polysulfone, or MYLAR plastic (as sold by Dupont deNemours Co. Inc.) epoxy.

Then, first inner conductive layers 25a and 25b are formed over the inner insulating layers 24a and 24b. The layers 25a and 25b may be laid down in a continuous or a patterned configuration depending upon the design of the integrated circuit and operate as an electrical power conductive plane or network for the package. A typical film for the layers 25a and 25b (as well as the other conductive layers included in the module 12) would consist of 300-500 Angstroms of Cr overcoated with one micron or more of copper.

Second inner insulating layers 26a and 26b are then deposited onto the conductive layers 25a and 25b. It should be noted here that the conductive layers 25a and 25b (as well as subsequently applied conductive layers) are terminated a short distance from all feedthrough holes to which they are not to be connected in order to allow the subsequently applied layers of insulating material to isolate the conductive layer from conductive material which is subsequently flowed into the feedthrough holes.

In a similar manner, two additional pairs of conductive and insulating layers are successively deposited to complete the interconnecting module 12. These comprise patterned or continuous conductive layers 27a and 27b which are deposited over the insulating layers 26a and 26b to form a conductive ground pattern or plane for the package. In a similar manner as explained above, the conductive layers are stopped short of the location of those feedthrough holes to which they are not to be connected in order to electrically isolate these conductive layers from the conductor material in the holes.

The outermost or upper patterned signal conductors 29a and 29b are now formed over the outermost insulating layers 28a and 28b. These latter conductors serve as signal transmission lines to provide electrical signal interconnections between chips located on one side of the interconnecting module 12, as will be apparent hereinafter. Final outer layers of insulation 30a and 30b are then formed to cover the patterned conductive signal transmission lines 29a and 29b.

In the above fabrication method, the techniques for depositing the conductive and insulating films are conventional in nature. A prefered embodiment would apply the insulating layers 24a, 24b, 26a, 26b, 28a, 28b, 30a and 30b by a conventional spin coating process. The patterned conductive films are applied by evaporation, sputtering or electroplating processes. It should be understood that the conductive layers are formed to take on specific patterns or runs which are laid out in the light of a preplanned design for the signal, power and ground interconnections including full and partial electrical feedthroughs. Standard photolithography methods may be employed.

The above formed interconnect module 12 is next bored to provide holes in which the various conducting feedthroughs are to be implemented. A technique for boring the holes comprises laser drilling, which rapidly produces small diameter feedthrough bores, for example, in the range of 20 to 100 microns, such small diameter feedthrough bores beneficially permitting the elongated portions of patterned conductors to be densely spaced together. A suitable laser drilling technique is described in an article by T. R. Anthony, entitled "Diodes Formed by Laser Drilling and Diffusion", Journal of Applied Physics, Vol. 53 (December 1982), pps. 19154–19164, the entirety of which is incorporated herein by reference. While the laser drilling technique of the Anthony article is directed primarily to boring feedthrough holes through monocrystalline silicon, the same drilling technique is equally applicable to drilling through other materials incorporated into the above design as described.

In the formation of a full conducting feedthrough as shown at 36 in FIG. 2, laser drilling of the interconnect module 12 is suitably utilized to bore through multiple layers of the insulating material, but ordinarily not through inner conductive layers which are preferably patterned so as to be dielectrically spaced from conducting feedthroughs, as seen in the vicinity of feedthrough 36 in FIG. 2. If, however, the conductor layers have not been spaced from the conducting feedthroughs, laser drilling may proceed, (as described in the Anthony article, for example) until the patterned conductors are reached by the laser beam. The patterned conductors thereupon constitute automatic drilling stops, at least where they comprise aluminum or copper, since such materials resist laser drilling. Conductors can then be removed by an increase in laser power, a doubling or greater increase typically being sufficient. In the alternative, a metal etching removal technique may be employed at this point in the process. In the formation of partially conducting feedthroughs, that is feedthroughs which proceed from the exterior of the interconnecting module to one of the intermediate conducting layers, laser drilling suitably proceeds as described in the Anthony article, until the appropriate patterned conductive layer is met at which point an automatic drilling stop is indicated.

Once the interconnecting module 12 has been laser drilled to provide for full and partial feedthroughs 36 and 38, the entire interconnecting module is preferably subjected to an isotropic etchant, for removing thermally damaged silicon material in the various bores and any accumulation of semiconductor material at the upper and lower entrances to the feedthrough bores. Suitable isotropic etchants for this purpose are well known. Such etching process proceeds until the point at which the unwanted semiconductor material in the feedthrough bores is substantially removed rendering the bores more uniformly cylindrical with the unwanted accumulation of semiconductor material at the bore entrances substantially removed. Any contaminant material may be similarly removed by use of an appropriate etchant. While laser drilling is the preferred technique for providing feedthrough bores in the interconnecting module 12, other techniques may be employed such as drilling by mechanical or ultrasonic means.

Once suitable feedthrough bores have been formed, maximum dielectric separation between adjacent conducting feedthroughs is then preferably achieved by oxidizing the various bores, steam oxidation being preferred. A resultant buildup of silicon dioxide 23c in the bores of about 1 micron is preferred. The bores are then partially or completely filled with a suitable conducting medium, various techniques for accomplishing this described, for example, in an article by T. R. Anthony, entitled "Forming Electrical Interconnections Through Semiconductor Wafers", Journal of Applied Physics, Vol. 52 (August 1981), pps. 5340–5349, the entirety of which is incorporated herein by reference. This article, in particular, describes several techniques for the formation of electrical interconnections through small bores in silicon-on-sapphire conducting wafers, generally applicable to the present interconnecting module 12 as described above, including the techniques of capillary wetting, wedge extrusion, electroless plating, double sided sputtering, and through hole electroplating.

In more detail, the capillary wetting and wedge extrusion techniques as described in the Anthony article are techniques in which an organic resineous liquid containing conductive particles is introduced into the various (preferably oxides) bores. The liquid, when cured, forming a permanent electrical conductor throughout the length of each bore. For bores that penetrate entirely through the interconnecting module 12 (e.g., the bore for conducting feedthrough 36), the effectiveness of the foregoing techniques is preferably enhanced through the use of hydraulic pressure to force the conductive fluid or liquid into the bores or the use of vacuum to aid in drawing into the bores the conductive liquid.

Two further techniques for forming conductive feedthroughs in bores of the above-noted type comprise further capillary wetting techniques. One technique involves the use of a liquid organo metallic compound containing metal ions, which may be filled with conductive particles and which, when cured, forms metallic conducting feedthroughs. Suitable organo metallic compounds are known as liquid brites in the ceramic and glassware industries, the liquid brites being used for pictorial decoration of ceramic and glassware articles. A second capillary wetting technique involves the use of a molten metal, such as aluminum, which is molten to such degree as to be flowable in which, when cooled, forms conducting feedthroughs. The effectiveness of these capillary wetting techniques may be enhanced through the use of hydraulic pressure or vacuum to assist in the transport into the bores, by capillary action of the respective liquid conductive mediums.

The chip holding assemblies 14a and 14b are constructed using techniques similar to those discussed above with respect to fabrication of the interconnect module 12. The plates 41, 48 of the assemblies are made of silicon material, primary plate 41 being laser drilled to provide the needed feedthroughs 46 in preplanned locations. The plates 41 are then oxidized to form a layer 41a of dielectric oxide over their entire outer surfaces. The feedthroughs 46 are then filled with appropriate conductive material having inner and outer contacts 51 and 52 integral therewith, the feedthroughs 46 being electrically isolated from each other by the oxide coating. Upstanding separator/spacer plates 42 are then soldered or glued in place to form a base for ultimate support of the overlying secondary or top plate 48. The chips 62 of the type having bumped solder terminals 60 on one face thereof are now deposited on associated inner contacts 51 carried on the inside surface of the plate 41 and the chips 62 are fixed in place either permanently by a solder process or temporarily by virtue of compression provided by gauze 49 which is trapped between the top of the chips 62 and the plate 48. A preferred material for the gauze 49 is stranded copper which serves (when the covering wall 48 is in place) to resiliently urge the chips 62 toward the contacts 51 on the primary plate 41. The cover plate 48 is then soldered to the adjacent portions of the spacer segments 42 to complete the hermetic enclosure 40 for the chips 62.

It is a feature of the present invention that integrated circuit chips 62 can be tested for defects through wafer contacts 52. Thus, defective chips can be easily replaced individually prior to being formed into a completed package 10 since they may be only frictionally mounted in place in the chip holding assemblies.

In order to complete the electrical connections to the chip package 10, power and ground connections are made to a preselected number of package contacts 70 (FIG. 1) on the periphery of the interconnect module 12. The power and ground potentials are carried via the conductive layers 25a and 25b, and 27a and 27b and partial feedthroughs 38 to associated power and ground contacts 30 on the surface 18a and 18b of the module 12. From there they are connected to the associated power and ground connections on the chips 62 via associated ground and power feedthroughs 46 and contacts in the primary plates 41 of the chipholding assemblies 14a and 14b. Signal transmission connections to and from the chips 62 are similarly made via the signal transmission lines 29a and 29b which are interconnected in a preselected manner to contacts on the periphery of the module 12 and to associated terminals on the chips 62 via the conductive feedthroughs 46 in the plate 41 of the chipholding assemblies. Signal transmission connections between chips on opposite sides of the module 12 are made in a similar manner via electrical feedthroughs 46 on the plates 41 and associated full conductive feedthroughs 36 in the module 12.

As previously explained, package 10 is assembled with interconnect 12 sandwiched between the two chipholding assemblies 14a and 14b. Chips 62 on the same chip holding assembly (such as 14a) communicate with each other by way of feedthroughs through plate 41, and signal transmission lines 29a in the proximate conductor layer 29. Power and ground potentials are brought into the chips 62 via peripheral contact 70 on the module 12, conductive layers 25a, 25b, 27a and 27b, associated partial feedthroughs 38 associated power and ground feedthroughs 46 through the primary plate 41 of a chip holding assembly and appropriate terminals on chip 62. Communication between chips 62 in different assemblies 14a and 14b takes place, as alluded to earlier, via full feedthroughs 36 which pass through the interconnect module 12 to couple together signal carrying terminals of chips 62 on opposite sides thereof. Module architecture in which chips mainly communicate with neighboring VLSI chips is emphasized to minimize the length of signal transmission line interconnects between chips.

FIG. 4 shows an alternate embodiment of the present invention in which flip-chips 62 are directly connected to interconnect module 12. Module 12 is essentially the same as described above in connection with the preferred embodiment, however, the signal ground, and power contacts on the chips 62 surfaces make a direct connection to associated contacts on the module 12.

A pair of heat sink panels 72 is provided to remove heat from the package and to hold the package together. As previously described with reference to FIG. 3, each flip-chip 62 is backed by a resilient, thermally conductive block 49, consisting of copper filament gauze, which provides a thermal pathway between the flip chip and the proximate heat sink panel. The package 10 of FIG. 4 is held together by peripheral bolts 75 passing through opposed panels 72, with the interconnect module 12 being supported by means of upstanding spring loaded pogo-stick like supports 76 which operate to float the module 12 between the panels 72 and they also provide power and ground connections to module 12. The compliant gauze 49 also serves, as previously discussed, to urge the chips 62 into contact with the module 12.

While contacts 51 in plates 41 are shown as direct extensions of the feedthroughs 46, it will be understood that they may instead form a part of a chip socket which may be interposed between a chip and the plate 41.

As an alternative to the laser drilling techniques disclosed above for fabricating the interconnect module 12, other conventional techniques for forming the appropriate conducting feedthroughs may be employed. Some of these techniques, rather than drilling a hole through a previously completed multilayer substrate, form the vias incrementally by providing suitably registered and conductor filled holes in each layer as it is formed. The thicknesses of the various layers of the preferred embodiment may be varied depending on their function. In cases where conductive layers are to carry relatively high currents (such as in the power and ground layers and feedthroughs associated therewith), it is expected that relatively thicker layers would be employed.

While the present invention has been described with reference to the preferred embodiment, it will be understood that the present invention will admit to modifications, changes, variation, substitutions and equivalents as might occur to those skilled in the art without departing from the spirit and scope of this invention. Accordingly, it is intended that the invention herein be limited only by the appended claims.

What is claimed is:

1. A hybrid integrated circuit chip package comprising:

a multilayer interconnecting module having first and second opposed substantially planar major surfaces each having a plurality of electrical contacts thereat, said contacts including signal contacts and including first and second multilayer substrates symmetrically disposed on opposed sides of a central insulating layer, said first substrate having a first exposed surface which comprises said first major surface of said module and said second substrate having a second exposed surface which comprises said second major surface of said module;

each of said first and second substrates comprising:
a substantially planar patterned conductor layer forming a plurality of signal transmission lines and a layer of electrical insulation thereover;
a plurality of conductive feedthroughs extending inward from said contacts at said exposed surface, said feedthroughs including partial signal feedthroughs each of which conductively connects one of said signal contacts with one of said signal transmission lines and full feedthroughs each of which extends through one of said substrates and said central insulating layer and is continuous with a full feedthrough in the other of said substrates to connect a contact at said first exposed surface with a contact at said second exposed surface a plurality of first integrated circuit chips, each of said first chips being:
  positioned in substantial alignment with an associated group of said signal contacts at said first exposed surface, and
  electrically connected to at least some of said signal contacts in its associated group; a plurality of second integrated circuit chips each of said second chips:
  positioned in substantial alignment with an associated group of said signal contacts at said second exposed surface, and
  electrically connected to at least some of said signal contacts in its associated group; at least one of said first chips and at least one of said second chips being conductively interconnected by way of said full feedthroughs; and at least two of said first chips being conductively interconnected by way of selected ones of said partial feedthroughs and selected ones of said signal transmission lines of said first substrate;

whereby the length of the interconnections between different chips is minimized.

2. The package recited in claim 1 wherein said contacts include power contacts and ground contacts and each of said substrates further includes:

separate ground plane and power layers of patterned conductors; and said feedthroughs include:
  partial power feedthroughs each of which extends inward from one of said power contacts to said power layer;
  partial ground feedthroughs each of which extends inward from one of said ground contacts to said ground layer.

3. The package recited in claim 1 wherein said first and second chips are respectively mounted in first and second hermetically sealed enclosures.

4. The package recited in claim 3 wherein:

each of said first and second chips includes a plurality of terminal pads each of said enclosures comprises a primary plate juxtaposed with the corresponding surface of said module, said primary plate having formed therein a plurality of enclosure electrical feedthroughs, said enclosure feedthroughs making contact at an external end thereof with said signal contacts and at an internal end thereof with said pads; and said package further includes means for holding said enclosures in contact with said module.

5. The package recited in claim 4 wherein each of said enclosures further includes:

a secondary plate spaced from said primary plate; and a resilient, thermally conductive member located between said secondary plate and said chips disposed within said enclosure for biasing said chips into contact with said internal end of said enclosure feedthroughs.

6. The package recited in claim 5 wherein each of said enclosures further includes spacer plates which extend from said primary plate to said secondary plate to form a hermetically sealed enclosure.

7. The package recited in claim 4 wherein said central insulating layer, said chips and said enclosures are made of substantially identical silicon material.

8. A hybrid integrated circuit chip package comprising:

a first and second chip-holding wafer assemblies;

a multilayer interconnect module disposed between said first and second chip-holding wafer assemblies, said interconnect module including first and second multilayer substrates symmetrically disposed about a central insulating layer, said first substrate having a first substantially planar surface adjacent said first chip-holding assembly, said second substrate having a second substantially planar surface adjacent said second chip-holding assembly;

each of said multilayer substrates comprising:
  a signal layer containing a substantially planar pattern of conductors including a plurality of signal transmission lines,
  a power layer containing a substantially planar pattern of conductors including a plurality of power lines, and
  a ground plane layer disposed between said signal layer and said central insulating layer,
  said first and second substrate surfaces each including a plurality of signal contacts, power contacts and ground contacts,
  a first plurality of partial feedthroughs extending into said substrate and conductively interconnecting one of said signal contacts with one of said signal transmission lines therein,
  a second plurality of partial feedthroughs extending into said substrate and conductively interconnecting one of said ground contacts with said ground plane layer, and
  a third plurality of partial feedthroughs extending into said substrate and conductively interconnecting one of said power contacts with one of said power lines in said power layer;
  said feedthroughs being electrically isolated from the immediately surrounding substrate;

said module including a plurality of full feedthroughs each extending between said first and second substrate surfaces and conductively interconnecting one of said signal contacts on said first surface to one of said signal contacts on said second surface;

each of said chip-holding wafer assemblies including first and second substantially parallel, mutually spaced wafer plates;

each of said first wafer plates comprising:
  first and second plate surfaces, said first plate surface facing the adjacent one of said substrate surfaces and being disposed substantially parallel to said adjacent substrate surface and including a plurality of wafer assembly signal contacts thereon, said second plate surface facing the second wafer plate of that assembly and having a plurality of internal contacts disposed thereon,
  a plurality of full feedthroughs extending through said first plate between said first and second plate surfaces and conductively interconnecting said internal contacts on the second surface thereof with corresponding wafer assembly signal contacts aligned therewith on said first surface thereof; and a plurality of integrated circuit chips each disposed within one of said wafer assemblies and electrically connected to selected ones of said internal contacts of said assembly;

whereby the length of the interconnections between chips disposed in said first and second chip-holding wafer assemblies is minimized.

9. A hybrid integrated circuit chip package comprising:
- a multilayer interconnect module including first and second multilayer substrates symmetrically disposed about a central insulating layer, said module having first and second substantially parallel external surfaces, said first external module surface comprising an external surface of said first substrate and said second module surface comprising an external surface of said second substrate;
- each of said substrates comprising:
    - a signal layer containing a substantially planar pattern of conductors including a plurality of signal transmission lines and
    - a ground plane layer disposed between said signal layer and said insulating layer, said external surface of said substrate including a plurality of signal contacts;
    - a plurality of full feedthroughs extending from said external substrate surface through one of said substrates and said central insulating layer and being continuous with a full feedthrough in the other of said substrates and conductively interconnecting one of said contacts on that substrate to one of said contacts on said other of said substrates;
    - a first plurality of partial feedthroughs extending into said substrate and conductively interconnecting one of said signal contacts thereon with one of said signal transmission lines;
    - each of said feedthroughs being electrically isolated from the immediately surrounding substrate; and
- a plurality of integrated circuit flip-chips located on each of said module surfaces and positioned over an associated group of said signal contacts and being electrically connected thereto, some of said flip-chips on each of said surfaces having associated signal contacts connected to full feedthroughs which interconnect those flip-chips to flip-chips positioned on the other of said module surfaces;
- some of the flip-chips located on one of said module surfaces being interconnected by way of some of said partial feedthroughs and signal transmission lines connected thereto;
- whereby the length of the interconnections between chips on said first and second substrate surfaces is minimized.

10. The module of claim 9 wherein each of said substrates further includes:
- a plurality of power lines, a plurality of power contacts and a plurality of ground contacts on said external substrate surface;
- a second plurality of partial feedthroughs each extending into said substrate and conductively interconnecting one of said ground contacts with said ground plane layer;
- a third plurality of partial feedthroughs each extending into said substrate and conductively interconnecting one of said power contacts with one of said power lines; and
- each of said second and third partial feedthroughs being electrically isolated from the immediately surrounding substrate.

11. The module of claim 9 further comprising:
- a pair of heat sink panels bracketing said substrates and said central insulating layer therebetween; and
- each of said panels including:
    - means for providing power and ground connections to said power and ground contacts respectively on the facing substrate surfaces; and
    - a thermally conductive block interposed between each of said flip-chips and the proximate heat sink panel.

12. The package recited in claim 2 wherein said first and second chips are disposed with their contacts disposed in direct contact with said associated module signal contacts.

* * * * *